(12) United States Patent
Chen et al.

(10) Patent No.: US 9,231,120 B2
(45) Date of Patent: Jan. 5, 2016

(54) SCHOTTKY DIODE WITH LEAKAGE CURRENT CONTROL STRUCTURES

(75) Inventors: Weize Chen, Phoenix, AZ (US); Xin Lin, Phoenix, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 73 days.

(21) Appl. No.: 13/537,299

(22) Filed: Jun. 29, 2012

(65) Prior Publication Data

US 2014/0001594 A1  Jan. 2, 2014

(51) Int. Cl.
*H01L 29/872* (2006.01)
*H01L 29/417* (2006.01)
*H01L 29/66* (2006.01)
*H01L 29/06* (2006.01)

(52) U.S. Cl.
CPC .......... *H01L 29/872* (2013.01); *H01L 29/0692* (2013.01); *H01L 29/417* (2013.01); *H01L 29/66143* (2013.01)

(58) Field of Classification Search
CPC ............................. H01L 29/872; H01L 29/417
USPC .................................................. 257/471–486
See application file for complete search history.

(56) References Cited

U.S. PATENT DOCUMENTS

| | | | |
|---|---|---|---|
| 5,077,494 A | 12/1991 | Bowers et al. | |
| 6,855,981 B2 | 2/2005 | Kumar et al. | |
| 7,064,407 B1 | 6/2006 | Mallikarjunaswamy | |
| 7,126,314 B2 | 10/2006 | McGinty et al. | |
| 7,915,704 B2 | 3/2011 | Lin et al. | |
| 7,928,509 B2 | 4/2011 | Huang | |
| 7,972,913 B2 | 7/2011 | Lin et al. | |
| 8,604,582 B2 * | 12/2013 | Lee et al. | 257/471 |
| 2003/0042538 A1 | 3/2003 | Kumar et al. | |
| 2005/0245020 A1 * | 11/2005 | Zhu et al. | 438/213 |
| 2006/0176029 A1 | 8/2006 | McGinty et al. | |
| 2009/0294865 A1 * | 12/2009 | Tang et al. | 257/369 |
| 2010/0164050 A1 * | 7/2010 | Ho et al. | 257/484 |
| 2010/0187577 A1 | 7/2010 | Lin et al. | |
| 2010/0295101 A1 | 11/2010 | Huang | |
| 2011/0156682 A1 | 6/2011 | Girdhar et al. | |

* cited by examiner

*Primary Examiner* — Mohsen Ahmadi
*Assistant Examiner* — Stephen Bradley
(74) *Attorney, Agent, or Firm* — Charlene R. Jacobsen

(57) ABSTRACT

A Schottky diode includes a device structure having a central portion and a plurality of fingers. Distal portions of the fingers overlie leakage current control (LCC) regions. An LCC region is relatively narrow and deep, terminating in proximity to a buried layer of like polarity. Under reverse bias, depletion regions forming in an active region lying between the buried layer and the LCC regions occupy the entire extent of the active region and thereby provide a carrier depleted wall. An analogous depletion region occurs in the active region residing between any pair of adjacent fingers. If the fingers include latitudinal oriented fingers and longitudinal oriented fingers, depletion region blockades in three different orthogonal orientations may occur. The formation of the LCC regions may include the use of a high dose, low energy phosphorous implant using an LCC implant mask and the isolation structures as an additional hard mask.

8 Claims, 4 Drawing Sheets

SCHOTTKY DIODE WITH LEAKAGE CURRENT CONTROL STRUCTURES

BACKGROUND

1. Field

Subject matter disclosed herein is in the field of semiconductor devices and, more specifically, semiconductor devices that employ Schottky diodes.

2. Related Art

A Schottky diode fabricated in a CMOS process often employs a silicide overlying n-doped or p-doped silicon as the diode's Schottky barrier junction. While Schottky diodes exhibit low forward turn-on voltages and fast switching characteristics, they may also exhibit unacceptable or undesirable reverse bias leakage currents and breakdown voltages. Techniques to address these issues tend to increase the size of the device, increase the complexity of the fabrication process, or both.

BRIEF DESCRIPTION OF THE DRAWINGS

Subject matter disclosed herein is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
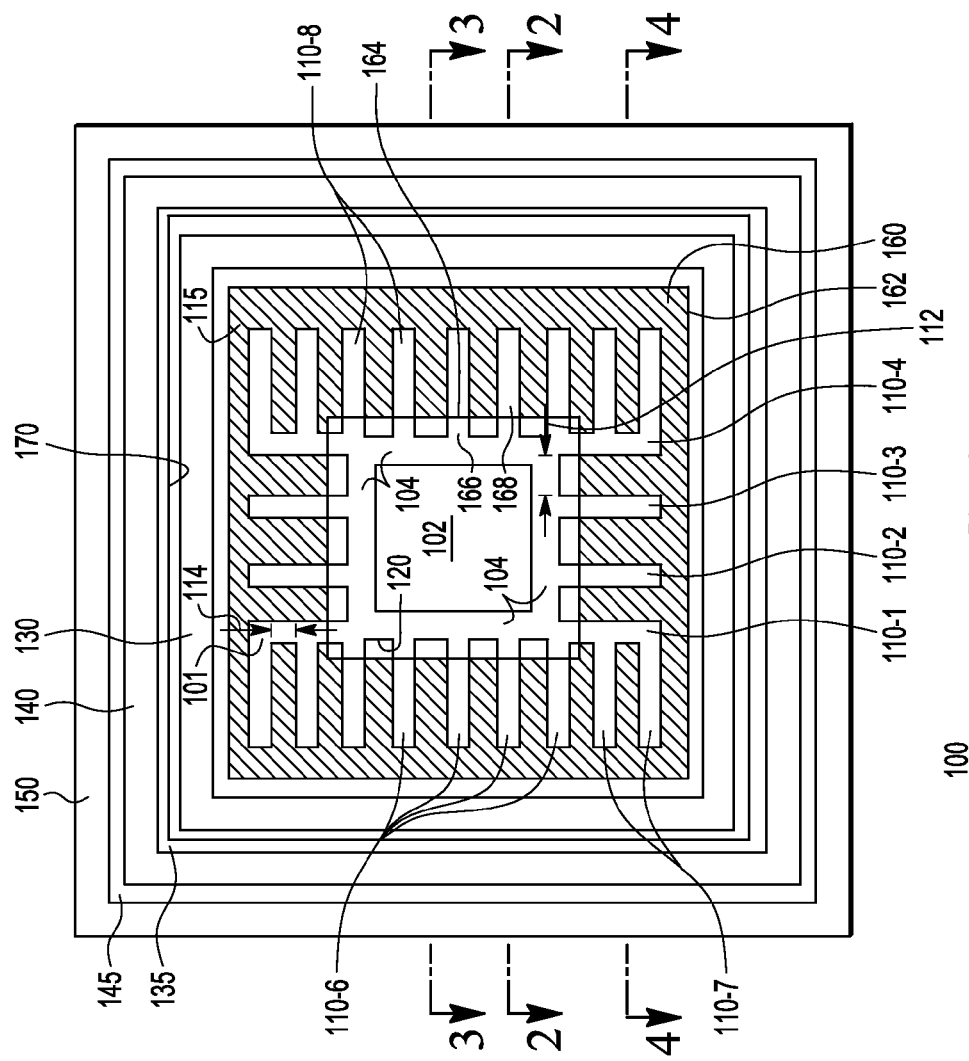
FIG. 1 is a top view of selected elements of a disclosed embodiment of a Schottky diode.

Schottky diodes implemented in conventional CMOS processes generally include a silicide formed over a lightly doped n-type or p-type crystalline silicon area to form the diode's Schottky barrier junction or metal-semiconductor junction. In these diodes, image force barrier lowering may reduce the diode's breakdown voltage, increase the diode's leakage current, or both.

Image force barrier lowering results from the accumulation of image charges in the silicide electrode as carriers approach the Schottky barrier junction. The electric potential associated with these image charges reduces the junction's effective barrier height. Although the reduction in barrier height may be relatively small compared to the overall barrier height, it may nevertheless, negatively impact breakdown voltage and produce a leakage current that is more strongly dependent on the voltage.

The inclusion of additional elements, such as a depletion mode laterally diffused MOS (LDMOS) transistor in series with the Schottky diode, may partially alleviate the accumulation of image charges in the silicide, but the increased device size and additional processing steps that may be required are undesirable.

In one aspect, subject matter disclosed herein includes a semiconductor diode formed on a substrate of silicon or another type of semiconductor. The substrate may include a buried semiconductor layer located at a predetermined depth below the substrate upper surface. A region of the substrate overlying the buried semiconductor layer may be referred to herein as an active region while a region of the substrate underlying the buried semiconductor layer may be referred to as a bulk portion of the substrate. In silicon-on-insulator (SOI) implementations (not depicted), the wafer substrate may include a buried oxide (BOX) or other buried dielectric layer. In these embodiments, the BOX layer may replace the buried semiconductor layer. To the extent that the buried semiconductor layer is employed to create a portion of a leakage current control depletion region, an analogous depletion region may be provided entirely by a different pn junction as discussed below. The substrate may further include one or more n-type or p-type epitaxial layers. In some embodiments, the active region itself may be part of an epitaxial layer formed on the bulk portion of the substrate.

Each of the semiconductor elements described herein may have one of two types of extrinsic polarity, either n-type or p-type. For the sake of clarity, the semiconductor elements of the embodiments depicted in the drawings and described herein are identified as either n-type or p-type. However, in other embodiments, all semiconductor elements identified as being n-type could be p-type and all elements identified as being p-type could be n-type. As used herein, the terms n-type, n-doped, n+, n−, and so forth refer to an extrinsic semiconductor with a net dopant concentration of donor atoms whereas the terms p-type, p-doped, p+, p−, and so forth refer to an extrinsic semiconductor with a net dopant concentration of acceptor atoms. Moreover, each of the semiconductor elements described herein may be described as being lightly, moderately, or heavily doped. In the absence of specific indications of carrier concentrations, lightly doped refers to a carrier concentration of less than 1E17/cm3, heavily doped refers to a carrier concentration of more than 1E19/cm3, and moderately doped refers to a carrier concentration that is neither lightly doped nor heavily doped. The "−" symbol may be used to designate a lightly doped carrier concentration and the "+" symbol may be used to designate a heavily doped carrier concentration.

In some embodiments, the buried semiconductor layer is a moderately doped n-type layer and the active region overlying the buried layer is a lightly doped p-type region. The active region may extend vertically from an upper boundary of the buried layer to the substrate upper surface. It will be understood however that references to the extrinsic polarity and carrier concentration of the active region refer to the extrinsic polarity and carrier concentration of the active region "as formed", i.e., before additional features and impurity distributions are formed in the active region.

A portion of the substrate upper surface lying between isolation structures is referred to herein as the device region of the upper surface. The device region extends from the substrate upper surface to a predetermined depth and, in the depicted embodiments, includes a plurality of diode elements. The diode elements located in the device region may include a Schottky barrier region, an ohmic contact region, and a region referred to herein as a leakage current control (LCC) region. In some symmetrically configured embodiments, including the embodiments depicted in the drawings and described below, the Schottky barrier region is centrally positioned between a pair of ohmic contact regions, with a pair of LCC regions positioned adjacent to exterior edges of the ohmic contact regions. In these embodiments, the pairs of ohmic contact regions at either end of the Schottky barrier region may include different portions of a single continuous ohmic ring surrounding the Schottky barrier region. Similarly, the pair of LCC regions may include different portions of a single LCC ring surrounding the ohmic ring. The LCC ring may be bordered by isolation structures such as shallow trench isolation structures.

In some embodiments, the Schottky barrier region is a lightly doped p-type silicon or other semiconductor region, the ohmic contact region is a heavily doped n-type region, and the LCC region is a moderately or lightly doped n-type region. A central portion of a fingered structure referred to herein as a device structure may include a silicide formed in contact with the underlying Schottky barrier region, the ohmic contact region, and the LCC region, maintaining each of the regions at the same potential. The device structure forms a Schottsky barrier junction with the Schottky barrier region and an ohmic contact with the ohmic contact region.

In some embodiments, a depth of the LCC regions is greater than a depth of the ohmic contact regions. The depth of the LCC regions may also be greater than a depth of the adjacent isolation structures.

A depth of an LCC region may be characterized in terms of a combined depletion region that includes a depletion region formed at a lower boundary of the LCC region junction and a depletion region formed at an interface between the buried layer and the active area. A lower boundary of the LCC region is located above, but in proximity to, an upper surface of the buried layer with the lightly doped active region situated between them. Under reverse bias conditions, a first depletion region forms in the active region at the junction with the LCC region and a second depletion region forms in the active region at the interface with the buried layer.

At the lower boundary of the LCC region, the LCC region is roughly parallel with the buried layer and the two depletion regions in the active area grow towards each other as the reverse bias potential increases. In some embodiments, the physical dimensions and electrical characteristics of the LCC regions, the active area, and the buried layer are designed to ensure that the sum of the depth of the two depletion regions is greater than the displacement between the LCC region and the buried layer. In this configuration, the active region between the LCC region and the buried layer will be substantially depleted of available carriers and there will be no path for current of any significance to traverse the active area between the LCC region and the buried layer.

In addition, if the device structure includes a plurality of relatively closely spaced fingers and the LCC regions are formed underlying portions of these structural fingers, an analogous, but differently-oriented, depletion phenomenon will occur beneath the fingers within the active region between any pair of adjacent LCC regions. The depletion regions around any two adjacent structural fingers will overlap and prevent leakage current in a direction that is orthogonal with respect to the depletion cutoff that occurs between the LCC region and the buried layer. By integrating LCC regions as described in conjunction with an appropriately configured device structure, the described depletion cutoff can entirely or substantially surround the Schottky barrier region with a depletion region current barrier and thereby reduce reverse bias leakage current.

The formation of the LCC region may be achieved using a high dose, low energy phosphorous implant, referred to herein as the LCC implant, either before transistors are formed, e.g., prior to deposition of a gate polysilicon, or after transistor gates are formed, e.g., after gate etch. Significant ion channeling may occur under these conditions and the LCC region will have a greater junction depth than regions formed by higher energy implants including the implant used to form the ohmic contact regions and the implant used to form the Schottky barrier region. In some embodiments, the energy of the LCC implant is sufficiently low so that the isolation structures act as a mask to the implant and the LCC region is self aligned to the isolation structures. An LCC region mask may be employed to define a boundary between the LCC region and the adjacent ohmic contact region.

Figure 2:
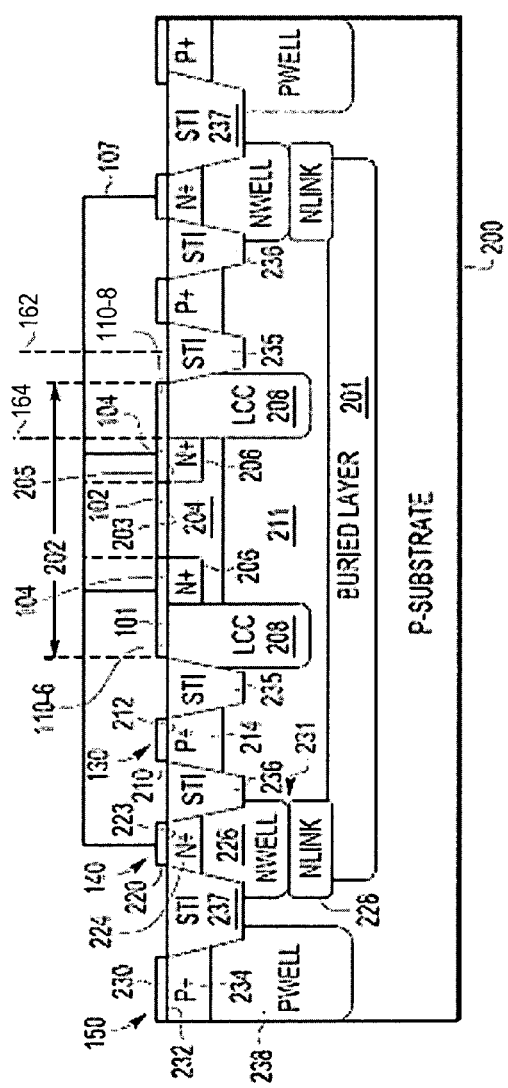
FIG. 2 is a cross sectional view taken along section line 2-2 of FIG. 1.

Referring now to the drawings and, more specifically, FIG. 1 and FIG. 2, FIG. 1 is a top view of selected features or an embodiment of an Schottky diode 100 and FIG. 2 is a sectional view of Schottky diode 100 taken along section line 2-2. As depicted in FIG. 1, Schottky diode 100 includes a structure referred to herein as device structure 101 that includes a Schottky barrier structure 102, an ohmic contact region 104 adjacent to Schottky barrier structure 102, and a plurality of structural fingers 110. In the depicted embodiment, Schottky barrier structure 102 is a substantially square or rectangular silicide region and ohmic contact region 104 is an annular strip surrounding Schottky barrier structure 102. In embodiments depicted herein, the silicide of Schottky barrier structure covers the entire device structure 101. In other embodiments, however, structural fingers 110 might not be silicided. In still other embodiments, if the structural fingers 110 are silicide structures and the LCC regions themselves have a sufficient doping concentration, the ohmic contact region 104 may be omitted and any contacts may be made directly to the silicide structural fingers.

In the embodiment depicted in FIG. 1, structural fingers 110 include latitudinal fingers (e.g., 110-6, 110-7) that are oriented parallel to an imaginary axis (not depicted) and longitudinal fingers (110-1, 110-2, 110-3, and 110-4) that are oriented perpendicular to the imaginary axis. In the depicted embodiment, some of the latitudinal fingers connect to ohmic contact region 104, (e.g., fingers 110-6) while some of the latitudinal fingers connect to a longitudinal finger (e.g., fingers 110-7 connect to longitudinal finger 110-1). The specific configuration of fingers 110 is an implementation detail and other embodiments of the peripheral regions of device structure 101 may employ physical configurations of fingers and other structures that differ from the depicted configuration.

FIG. 1 depicts a region, referred to herein as LCC implant region 160, that defines a distal portion 168 and a proximal portion 166 of any structural finger 110 that connects to ohmic contact region 104. Distal portions 168 of applicable structural fingers 110 are exposed to the LCC implant while proximal portions 166 are not. As depicted in FIG. 2, the LCC implant introduces a relatively narrow and relatively deep LCC region 208 underlying distal portions 168 of structural fingers 110. Under reverse bias of Schottky diode 100, LCC regions 208 function like JFET gate electrodes and create depletion regions at junctions between LCC regions 208 and the surrounding active area 211 of substrate 200. Similarly, a depletion region forms in active area 211 at its junction with the buried layer 201, which is electrically connected to LCC regions 208 through a cathode silicide structure 220, a cathode n+ region 224, an n-well region 226, and an n-type link region 228.

With appropriate control of the depth and doping of LCC regions 208, buried layer 201 and active region 211, the resulting depletion regions will occupy the entire extent of active region 211 between LCC regions 208 and buried layer 201 and thereby form a current barrier that prevents any mobile carriers in active region 211 from reaching an anode silicide structure 210. Moreover, as emphasized in FIG. 4 below, analogous depletion region barriers will form and occupy active region 211 between adjacent pairs of LCC regions 408-1, 408-2, etc. beneath the corresponding adjacent pairs of structural fingers 110-1, 110-2, etc. and thereby provide current barrier oriented in a second direction that is orthogonal to the first barriers.

In the embodiment of Schottky diode 100 depicted in FIG. 1, device structure 101 is located within an isolation region 115, which may be implemented using shallow trench isolation structures such as shallow trench isolation structures 235 depicted in FIG. 2. As seen in FIG. 1, isolation region 115 is surrounded by three concentric rings of silicide (130, 140, 150) separated by isolation rings (135, 145) discussed further below.

Referring to FIG. 2, Schottky diode 100 may be fabricated as part of a semiconductor wafer that includes a doped semiconductor substrate 200. In some embodiments, a bulk portion of substrate 200, i.e., a portion of substrate 200 underlying buried layer 201, is a lightly or moderately doped p-type region. As indicated previously, the bulk portion of substrate 200 may include a BOX layer (not depicted) and one or more epitaxial layers (not depicted) of either extrinsic polarity.

As depicted in FIG. 2, n-type buried layer 201 is an n-doped impurity distribution oriented parallel to the substrate upper surface and located at a predetermined depth below the substrate upper surface. Buried layer 201 effectively defines a boundary between a bulk portion of substrate 200 and the active region 211 of substrate 200. In embodiments of substrate 200 that include a buried oxide layer, n-type buried layer 201 may be omitted.

In the depicted embodiment, Schottky barrier structure 102 (FIG. 1), together with ohmic contact region 104 (FIG. 1), and structural fingers 110, form a silicided central portion 202 (FIG. 2) of device structure 101. In this configuration, central portion 202 of device structure 101 forms a Schottky barrier junction 203 where device structure 101 overlies a lightly doped region referred to herein as Schottky barrier region 204. When a metal or a metal-like material such as device structure 101 is formed in contact with a lightly doped semiconductor such as Schottky barrier region 204, the band diagram of the resulting junction, referred to herein as a Schottky barrier junction 203, produces a diode that exhibits a low forward bias voltage drop and extremely fast switching characteristics relative to pn-junction diodes. In the depicted embodiment, Schottky barrier region 204 is a relatively shallow region that overlies an active region 211 of the same impurity type where active region 211 may have a lower doping concentration than first region 204. The use of two differently-doped regions beneficially improves the forward bias current and reduces reverse bias leakage current. Other embodiments may, however, employ a single region of relatively uniform doping concentration in place of Schottky barrier region 204 and active region 211.

The ohmic contact region 104 of FIG. 1 corresponds to the portion of device structure 101 overlying n+ regions 206 in FIG. 2. When a metal or metal-like material such as device structure 101 is formed in contact with a heavily doped semiconductor such as n+ region 206, an ohmic junction exhibiting a substantially linear I-V curve with a negligible turn on voltage results. Thus, device structure 101 forms an ohmic junction 205 with the underlying n+ region 206.

Still referring to FIG. 1 and FIG. 2, Schottky diode 100 includes a plurality of structural fingers 110 that extend away from ohmic contact region 104. In the embodiment depicted, structural fingers 110 include a set of four fingers 110-1 through 110-4 extending parallel to each other separated by a predetermined displacement 112. In the depicted embodiment, structural fingers 110-1 and 110-4 extend along left and right boundaries of ohmic contact region 104 and extend beyond upper and lower boundaries of ohmic contact region 104. In the depicted embodiment, a set of structural fingers 110-6 extend parallel to each other, separated by a displacement 114, away from a left edge 120 of ohmic contact region 104 while a second set of structural fingers 110-8 extend parallel to each other, separated by displacement 114, away from a right edge of ohmic contact region 104. Although FIG. 1 depicts a specific arrangement and placement of structural fingers 110, it should be appreciated by those of skill in the design of semiconductor devices that different configurations or arrangement of structural fingers 110 can be employed.

As depicted in FIG. 1, Schottky diode 100 includes a set of three substantially concentric rectangular or square silicide rings 130, 140, and 150. A first ring of isolation 135 lies between first silicide ring 130 and second silicide ring 140. A second ring of isolation 145 lies between second silicide ring 140 and third silicide ring 150.

As seen in FIG. 2, first silicide ring 130, also referred to herein as anode ring 130 includes an ohmic interface 212 between an anode silicide structure 210 and an underlying, heavily-doped semiconductor region identified as p+ region 214. Second silicide ring 140, also referred to herein as cathode ring 140, includes an ohmic interface 223 between cathode silicide structure 220 and an underlying, heavily-doped semiconductor region identified as cathode n+ region 224. Third silicide ring 150, also referred to herein as substrate contact ring 150, includes an ohmic interface 232 between a substrate silicide structure 230 and an underlying, heavily doped semiconductor region referred to herein as substrate p+ region 234. Substrate contact region 150 is not necessarily dedicated to the Schottky diode 100 and may be shared with other features of a device. In embodiments that employ an SOI wafer substrate, a substrate contact ring in proximity to the Schottky diode may be unnecessary and/or impractical.

Anode ring 130 provides an anode terminal to Schottky diode 100 by providing an ohmic contact to Schottky barrier region 204 via anode p+ region 214 and active region 211. FIG. 2 also depicts an electrically conductive interconnect 107 providing electrical continuity between cathode silicide structure 220 and device structure 101. It will be appreciated that interconnect 107 as depicted in FIG. 2 is a representation of one or more metallization structures that are not depicted in FIG. 2, i.e., interconnect 107 is a drawing element representing one or more backend metallization structures that will be formed subsequent to the fabrication processing stage associated with FIG. 2. Cathode silicide structure 220 also provides bias to the buried layer by providing an ohmic contact to a buried layer 201 through cathode n+ region 224, n-well region 226, and n-type link region 228. Substrate ring 150 provides bias to a p-type substrate 200 via substrate p+ region 234 and p-well region 238.

As depicted in FIG. 2, LCC regions 208 abut interior boundaries of shallow trench isolation structures 235. As depicted in FIG. 2, LCC regions 208 are narrow and deep regions relative to n+ regions 206. In the depicted embodiment, a depth of LCC regions 208 below an upper surface of substrate 200 is greater than a depth of shallow trench isolation structures 235. From a functional perspective, LCC regions 208 provide the equivalent of a gate electrode for a multi-dimensional junction field effect transistor. When LCC region 208 is reversed biased with respect to active region 211, a depletion region forms at the junction between LCC 208 and active region 211. Moreover, because buried layer 201 is in ohmic contact with LCC regions 208, LCC regions 208 and buried layer 201 share the same potential and, consequently, a depletion region also forms at the interface between buried layer 201 and active region 211.

As discussed previously, a depth of an LCC region 208 may be determined based on its proximity to buried layer 201 and the depletion regions that would form in active region 211 between LCC region 208 and buried layer 201 under reverse bias. If, as an example, the width of the depletion region within active region 211 at its junction with LCC region 208 is denoted as DL and the width of the depletion region within active region 211 at its junction with buried layer 201 is denoted as DB, and the depth of an upper boundary of buried layer 201 is denoted as DX, the depth of LCC region 208 is preferably determined by the value DX−(DL+DB). Thus, the depth of LCC region 208 may be characterized in terms of its "depletion distance" with respect to buried layer 201. The depletion distance, it will be appreciated by those of skill in semiconductor physics, is a function of the doping concentrations of LCC regions 208, buried layer 201, and active region 211, as well as the biasing conditions applied, but can be specified or approximated from simulations for a given fabrication process under given conditions. If the carrier concentrations of LCC 208 and buried layer 201 are both substantially greater than the carrier concentration of active region 211, the depletion region formed at the LCC/active junction and the depletion region formed at the buried/active junction will both extend primarily within active region 211. Thus, the cumulative depletion region within active region 211 is approximately equal to the sum of the two depletion regions up to the point at which the two depletion regions meet.

Figure 3:
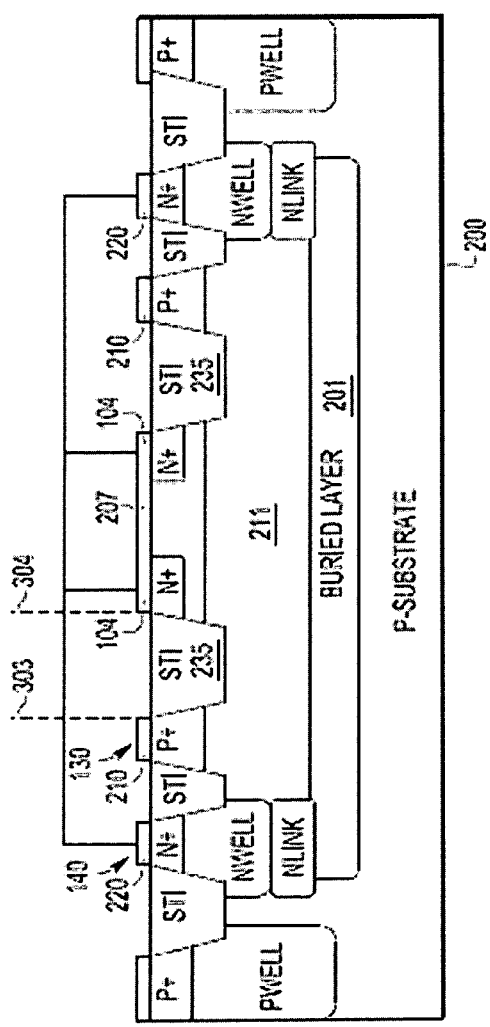
FIG. 3 is a cross sectional view taken along section line 3-3 of FIG. 1.
Figure 4:
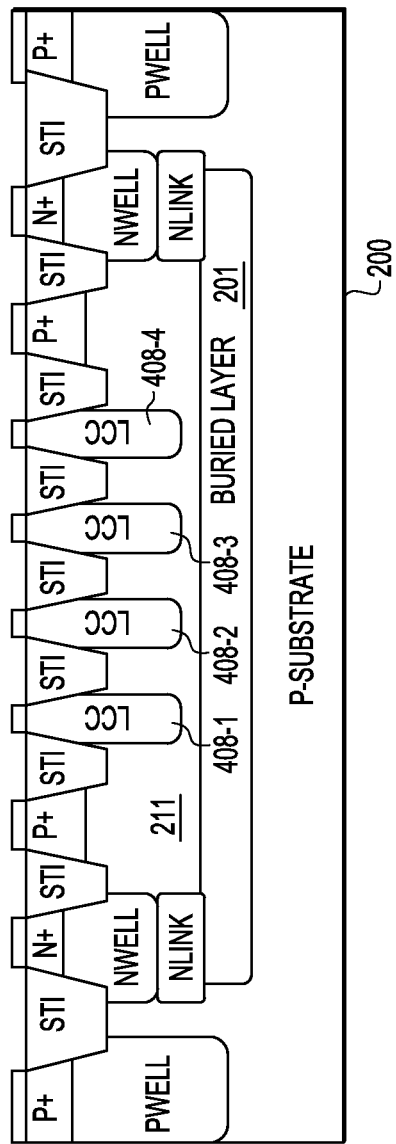
FIG. 4 is a cross sectional view taken along section line 4-4 of FIG. 1.

Referring now to FIG. 3 and FIG. 4 depicting cross sectional views of substrate 200 along the cross sections 3-3 and 4-4 respectively of FIG. 1. FIG. 3 depicts a view of Schottky diode 100 between a pair of latitudinal structural fingers 110-6. FIG. 4 depicts a view of Schottky diode 100 between a pair of latitudinal structural fingers 110-7 that are located "south" of a lower boundary of ohmic contact region 104 (see FIG. 1).

FIG. 3 reveals the effectiveness of shallow trench isolation structures 235 as a masking structure during the formation of LCC regions 208 (FIG. 2). From the top view of FIG. 1, shallow trench isolation structure 235 varies in width depending upon the presence or absence of structural fingers 110. At the section line 3-3, shallow trench isolation structure 235 extends from an interior boundary 303 of anode silicide structure 210 to an exterior boundary 304 of ohmic contact region 104. Although the LCC implant region 160 depicted in FIG. 1 includes a portion of shallow trench isolation structure 235 lying over section line 3-3, the presence of shallow trench isolation structure 235, coupled with the relatively low energy of the LCC implant, prevent formation of LCC regions underlying shallow trench isolation structure 235. Thus, as depicted in FIG. 3, the sectional view along line 3-3 of FIG. 1 contains no LCC region.

The sectional view of FIG. 3 might suggest the possibility of reverse bias leakage current flowing from device structure 101 to anode silicide structure 210. However, assuming that spacing 114 (FIG. 1) between two adjacent structural fingers 110 is sufficiently small, this potential leakage path would be effectively cut off in reverse bias by an overlap of depletion regions (not depicted) formed at vertically oriented junctions, i.e., junctions lying perpendicular to an upper surface of substrate 200, between structural fingers 110 and active region 211. This aspect of Schottky diode 100 is illustrated in FIG. 4.

FIG. 4 emphasizes the relatively closely spaced configuration of LCC regions 408-1 through 408-4 formed underlying longitudinal fingers 110-1 through 110-4. In reverse bias, depletion regions that will form in active region 211 at the vertically oriented junctions between LCC regions 408 and active region 211, will span the entire extent of active region 211 between adjacent pairs of LCC structures 408 and, as was the case in FIG. 2, the entire extent of active region 211 between a lower boundary of LCC regions 408 and buried layer 201.

As seen from FIG. 1 through 4, LCC regions 208 and 408 form underlying portions of structural fingers 110 covered by LCC implant region 160. In other words, the union of LCC implant region 160 and structural fingers 110 defines the location of LCC regions 208 and 408 as depicted in FIG. 2 and FIG. 4. In the embodiment depicted in FIG. 1, an outer perimeter 162 of LCC implant region 160 encompasses structural fingers 110 but excludes silicide rings 130, 140, and 150. Inner perimeter 164 of LCC implant region 160 encompasses the Schottky barrier structure 102 and the ohmic contact region 104, but divides at least some of the structural fingers 110 into proximal portions 166, which are not subjected to the LCC implant, and distal portions 168, which are. In this configuration, no LCC regions 208 or 408 form below ohmic contact region 104 or proximal portions 166 of structural fingers 110. On the other hand, LCC structures 208 and 408 will form underlying distal portions 168 of structural fingers 110. These boundaries are reproduced in the views of FIG. 2 for the sake of convenience and clarity.

FIG. 1 also depicts the boundaries of a mask for defining the Schottky barrier region 204 referred to above. A leakage control implant mask 170 encompasses structural fingers 110, ohmic contact region 104, and Schottky barrier structure 102. As depicted in FIG. 1, leakage control implant mask 170 also optionally encompasses anode ring 130.

Thus, an embodiment of Schottky diode 100 as disclosed herein includes a device structure 101 having a central portion including a Schottky barrier structure 102 and an ohmic contact region 104 and a plurality of structural fingers 110, at least some of which, connect to ohmic contact region 104. In the depicted embodiment, each structural finger 110 connected to the ohmic contact region 104 includes a distal portion 168 overlying an LCC region 208 and a proximal portion 166 overlying an ohmic contact region 206. The LCC regions 208 are relatively narrow and deep n-type regions, extending deeper into substrate 200 than the adjacent shallow trench isolation structures 235. Although inner perimeter 164 of LCC implant region 160 as depicted in FIG. 1 overlies structural fingers 110 thereby block the LCC implant from doping proximal portions 166 of structural fingers 110, all or substantially all structural fingers 110 may receive the LCC implant.

In the depicted embodiment, substrate 200 includes an n-type buried layer 201 comprising an n-type region extending parallel to the substrate upper surface. Buried layer 201 is located at predetermined depth below the substrate upper surface where the depth of buried layer 201 is greater than the depth of LCC regions 208. Buried layer 201 underlies an active region 211 of substrate 200. Other embodiments (not depicted) of substrate 200 may include a BOX layer in lieu of buried layer 201. In the depicted embodiment of substrate 200, active region 211 extends to the substrate upper surface and is formed as a p-type region, but the extrinsic polarity and carrier concentration of portions of active region 211 may be altered when additional Schottky diode elements are introduced. In proximity to the substrate upper surface, active region 211 includes a p− Schottky barrier region 204, an n+ ohmic contact region 206, and an n-type LCC region 208. LCC regions 208 terminate at and are aligned to shallow trench isolation structures 235. As discussed previously, the use of differently doped active region 211 and Schottky barrier region 204 is optional and, in other embodiments, a single lightly or moderately doped p-type impurity region may be used. For example, some embodiments may simply omit the impurity concentration 204.

Schottky diode 100 also includes an anode and a cathode coupled to Schottky barrier region 204. The cathode includes the silicided central portion 202 of device structure 101 interconnected with cathode ring 140, which includes cathode silicide structure 220 in ohmic contact with cathode n+ region 224, n-well 226, and n-type link region 228. The anode includes anode ring 130, which includes anode silicide structure 210 in ohmic contact with anode p+ region 214. Anode p+ region 214 is electrically coupled to Schottky barrier junction 203 through active region 211 and the optional Schottky barrier region 204. In the embodiment depicted in FIG. 2, an ion implantation that forms Schottky barrier region 204 may optionally introduce a similar impurity distribution into portions of active region 211 underlying p+ region 214. Thus, a portion of a p– impurity distribution may be present below a lower boundary of p+ anode regions 214.

Figure 5:
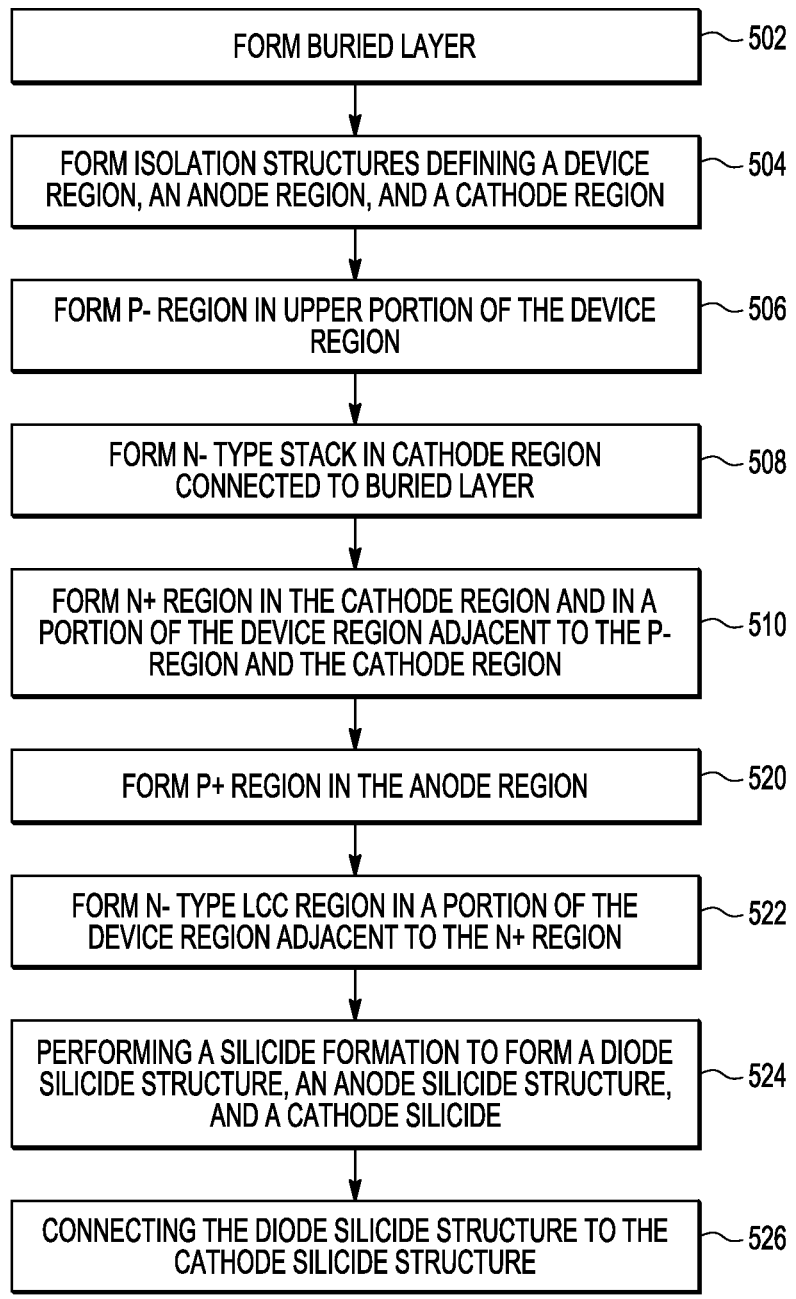
FIG. 5 is a flow diagram of a fabrication process for forming Schottky diodes described herein.

Turning now to FIG. 5, selected elements of an embodiment of a method 500 of fabricating Schottky diodes 100 are depicted. In the depicted embodiment, method 500 includes forming (block 502) an n-type buried layer 201 overlying a bulk portion of the substrate 200 and underlying a p-type active region 211 of the substrate. Formation of the buried layer 201 may be achieved using ion implantation in conjunction with an anneal, diffusion, or other high temperature process as is known in the field. Implant species may include any known donor atom implant species such as phosphorous, arsenic, and antimony. In embodiments that employ an SOI wafer and/or a BOX layer, the formation of buried layer 201 may be omitted.

Method 500 may further include forming (block 504) isolation structures 235, 236, 237 defining various regions of the substrate upper surface. For use in conjunction with fabricating Schottky diodes 100 as depicted in FIG. 1 through FIG. 4, the isolation structures may be shallow trench isolation structures that define a device region between isolation structures 235, an anode region between isolation structures 235 and 236, a cathode region between isolation structures 236 and 237, and a substrate bias region outside of isolation structures 237, each of which is isolated from adjacent regions by intervening isolation structures.

A lightly doped p-type Schottky barrier region 204 may be formed (block 506) using ion implantation, diffusion, epitaxial growth or another suitable process.

Method 500 may include the formation (block 508) of an n-type stack 231 providing electrical continuity between the cathode silicide structure 220 and the buried layer 201. In these embodiments, the n-type stack 231 may include cathode n+ region 224 forming an ohmic contact with the silicide cathode structure 220, n-well region 226, and n-type link region 228 linking the buried layer 201 to the n-well 226. The n-type stack 231 may be formed using a sequence of n-type ion implants using different recipes to control depth and carrier concentration. Although the depicted embodiment of n-type stack 231 includes n-type link region 228, other embodiments may omit such a region if n-well region 226 can connect directly to n-type buried layer 201.

The depicted embodiment of method 500 includes the formation (block 510) of heavily doped n-type regions 220 underlying the cathode silicide structure and within ohmic contact region 206 adjacent to the Schottky barrier region 204. Heavily doped p-type regions 214 may be formed (block 520) underlying the anode silicide structure 210.

Method 500 further includes the formation (522) of n-type LCC regions 208. As depicted in FIG. 2, the LCC regions 208 are positioned adjacent to the heavily doped ohmic contact regions 206 on one side and the isolation structures 235 on the other. In some embodiments, the formation of LCC regions 208 may be achieved using a high dose, low energy phosphorous implant. The LCC implant may be masked to confine the LCC implant to distal portions 168 of the structural fingers 110 as described previously. In addition, because the LCC implant energy is preferably low, the isolation structures 235 adjacent to the structural fingers 110 provide a hard mask for the LCC implant such that the LCC implant is substantially prevented from populating portions of substrate 200 underlying the isolation structures 235. Under these high dose, low energy conditions, significant channeling may occur and a depth of the resulting impurity distribution may be substantially greater that the depth of regions formed with higher energy implants or formed in other ways. In one exemplary embodiment, the LCC implant may be a phosphorous implant performed after gate etch using a dose of not less than 1 E 15 $cm^{-2}$ and an energy of not more than approximately 100 KeV. The energy employed may vary with the mass of the implant species, the thickness of the masking layer, whether it be a shallow trench isolation hard mask as described herein, another type of hard mask, a photoresist mask, or a combination thereof. In these embodiments, a depth of LCC region 208 may be in the range of approximately 0.5 to 2.5 microns, including embodiments in which a depth of LCC region 208 is in the range of approximately 1 to 1.5 microns.

After formation of the substrate elements, method 500 includes the formation (block 524) of the device silicide and other silicide structures depicted in FIG. 2. Silicide formation may be performed using conventional silicide techniques in which a metal or transition metal is deposited on a substrate having exposed silicon (crystalline or polycrystalline) and subjected to a heat step to react the metal with the underlying silicon and produce a silicide self aligned to the underlying silicon structure.

Method 500 as depicted in FIG. 5 may further include metallization or other processing (block 526) to provide electrical continuity between the device structure and the cathode silicide structure. It will be appreciated that the sequence indicated in FIG. 5 is a specific implementation and that other implementations may be used.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor diode, comprising:
   a substrate including:
      a buried layer vertically displaced below a substrate upper surface, wherein the buried layer is selected from a buried dielectric layer and a buried semiconductor layer, the buried semiconductor layer having a first extrinsic polarity;
      an active region overlying the buried layer and extending from the buried layer to the substrate upper surface, the active region having a second extrinsic polarity different than the first extrinsic polarity;

a surface region occupying a portion of the active region including and proximal to the upper surface of the substrate, wherein the surface region includes:

a Schottky barrier region, comprising a lightly doped region having the second extrinsic polarity;

a leakage current control (LCC) region comprising a doped region having the first extrinsic polarity, the LCC region extending from the upper surface of the substrate so that a lower boundary of the LCC region terminates at a horizontally oriented junction with the active region; and an ohmic contact region between the Schottky barrier region and the LCC region, wherein the ohmic contact region comprises a heavily doped region having the first extrinsic polarity; and a device structure formed in contact with the Schottky barrier region and the LCC region, the device structure including a central portion overlying the Schottky barrier region and the ohmic contact region and a plurality of structural fingers extending from the central portion, the plurality of structural fingers including pairs of the structural fingers arranged adjacent to one another.

2. The semiconductor diode of claim 1, further comprising an isolation structure having a first lateral edge adjacent to the LCC region.

3. The semiconductor diode of claim 2, wherein a depth of the isolation structure is less than a depth of the LCC region.

4. The semiconductor diode of claim 2, further comprising an anode structure laterally adjacent to a second lateral edge of the isolation structure.

5. The semiconductor diode of claim 1, wherein the structural fingers include:

proximal portions extending from the central portion to intermediate points; and distal portions extending from the intermediate points to end points of the structural fingers; and wherein the LCC region is confined to portions of the substrate underlying the distal portions of the structural fingers.

6. The semiconductor diode of claim 1, wherein the device structure overlies an isolation region surrounded by an anode ring.

7. The semiconductor diode of claim 1, further comprising:

an anode structure electrically connected to the Schottky barrier region via a heavily doped anode region and the active region; and a cathode structure electrically connected to the device structure and to the buried layer via a heavily doped cathode region of the substrate via a well region of the first extrinsic polarity type.

8. The semiconductor diode of claim 1, wherein the lower boundary of the LCC region is located above an upper boundary of the buried layer with the active region situated between the LCC region and the buried layer.

* * * * *